(12) United States Patent
Okoroanyanwu et al.

(10) Patent No.: US 8,715,912 B2
(45) Date of Patent: May 6, 2014

(54) METHOD FOR PRODUCING A HIGH RESOLUTION RESIST PATTERN ON A SEMICONDUCTOR WAFER

(75) Inventors: Uzodinma Okoroanyanwu, Northampton, MA (US); Thomas Wallow, San Carlos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 887 days.

(21) Appl. No.: 11/805,139

(22) Filed: May 21, 2007

(65) Prior Publication Data

US 2008/0292996 A1 Nov. 27, 2008

(51) Int. Cl.
*G03F 7/26* (2006.01)
(52) U.S. Cl.
USPC .......................... 430/313; 430/311
(58) Field of Classification Search
USPC .................................. 430/311, 313
See application file for complete search history.

(56) References Cited

U.S. PATENT DOCUMENTS 3,550,094 A * 12/1970 Norton .......................... 365/118
2004/0229158 A1* 11/2004 Meador et al. ............. 430/270.1

OTHER PUBLICATIONS

Goldfarb, et al., *Confinement effects on the spatial extent of the reaction front in ultrathin chemically amplified photoresists*, J. Vac. Sci. Technol. B 19(6), pp. 2699-2704 (Nov./Dec. 2001).
D'Amour, et al., *Modifications to Thermophysical Behavior in Ultrathin Polymer Films*, Advances in Resist Technology and Processing XX, Proceedings of SPIE vol. 5039, pp. 996-1007 (2003).

* cited by examiner

*Primary Examiner* — Kathleen Duda
(74) *Attorney, Agent, or Firm* — Farjami & Farjami LLP

(57) ABSTRACT

In one disclosed embodiment, a method for producing a high resolution resist pattern on a semiconductor wafer comprises depositing a blanket layer of material on a semiconductor wafer, forming a resist interaction substrate on the blanket layer of material, forming a resist layer of a pre-determined thickness on the resist interaction substrate, exposing the resist layer to a patterned radiation, and developing the resulting high resolution resist pattern. In one embodiment, patterned radiation is provided by an extreme ultraviolet (EUV) light source. In other embodiments, patterned radiation may be provided by an electron beam, or ion beam, for example. In one embodiment, the resist layer comprises a chemically amplified resist utilizing a photogenerated acid (PGA), and having a sublayer. In other embodiments, the resist layer includes an additive, for example, fullerite. One disclosed embodiment involves use of an ultra-thin resist layer in combination with a gold resist interaction substrate.

20 Claims, 9 Drawing Sheets

US 8,715,912 B2

METHOD FOR PRODUCING A HIGH RESOLUTION RESIST PATTERN ON A SEMICONDUCTOR WAFER

TECHNICAL FIELD

The present invention is generally in the field of semiconductor devices. More particularly, the invention is in the field of fabrication of semiconductor wafers.

BACKGROUND ART

During semiconductor wafer fabrication, patterned radiation can be used to produce very small lithographic patterns, such as nanometer-scale lithographic patterns, on a semiconductor wafer. In extreme ultraviolet (EUV) lithography, for example, a pattern formed on an EUV lithographic mask can be transferred to a semiconductor wafer by exposing a layer of resist formed on the semiconductor wafer to EUV light reflected from portions of a reflective surface.

Due to the very short wavelengths (high frequencies) used in EUV and other high resolution lithographic techniques, the patterning radiation utilized is highly absorbed by many resist materials. In addition, the radiation sources relied upon in some techniques are of limited brightness, further limiting the radiation dose available for lithographic patterning.

A conventional approach to compensating for low source brightness and the high absorbance of patterning radiation is to utilize a resist material including a photoactivated catalytic species, for example a photogenerated acid (PGA), to chemically amplify a latent image formed on the resist. However, heretofore unresolved difficulties in adequately controlling diffusion of PGAs at very small dimensions has limited the ability of chemically amplified resists to capture the ever finer patterns being produced in EUV and other high resolution lithographic techniques.

SUMMARY

A method for producing a high resolution resist pattern on a semiconductor wafer, substantially as shown in and/or described in connection with at least one of the figures, as set forth more completely in the claims.

DETAILED DESCRIPTION OF THE INVENTION

The present invention is directed to a method for producing a high resolution resist pattern on a semiconductor wafer. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the present invention, which use the principles of the present invention, are not specifically described in the present application and are not specifically illustrated by the present drawings.

Figure 1A:
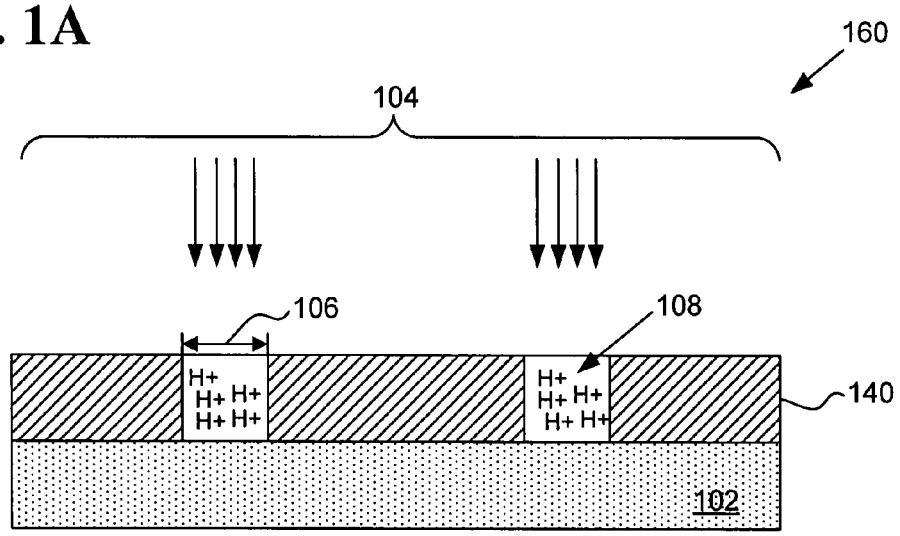
FIGS. 1A, 1B, and 1C show cross-sectional views of a semiconductor wafer during lithographic patterning, depicting a problem resolved by an embodiment of the present invention.
Figure 1B:
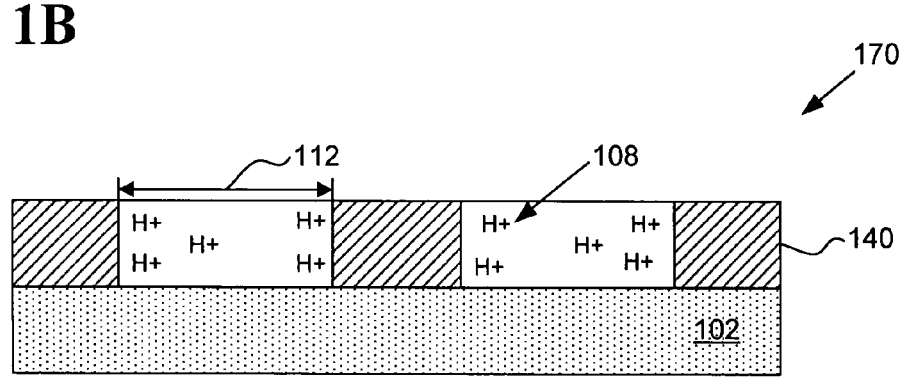
Figure 1C:
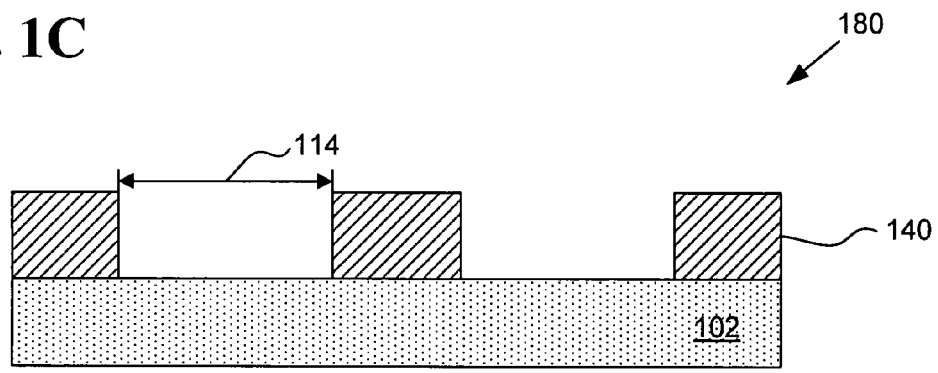

FIGS. 1A, 1B, and 1C show cross-sectional views of a semiconductor wafer during lithographic patterning, depicting a problem that can be resolved by the present invention. Structures 160, 170, and 180, appearing respectively in FIGS. 1A, 1B, and 1C, show cross-sectional views of resist layer 140 formed over semiconductor wafer 102, undergoing various fabrication steps. It should be noted that this representation is exemplary only, and in a typical fabrication process additional layers of material may be formed between semiconductor wafer 102 and layer of resist 140. Those additional layers are not shown in the present figures for purposes of brevity and simplicity of presentation.

In FIG. 1A, structure 160 shows resist layer 140 being exposed to patterned radiation 104, for example, extreme ultraviolet (EUV) light in a lithographic process involving a conventional chemically amplified resist. As a result of exposure to patterned radiation 104, photogenerated acid (PGA) 108 is formed in resist layer 140. Formation of PGA within resist layer 104, such as PGA 108, produces a latent image having desired dimension 106 in layer of resist 140.

FIG. 1B illustrates a problem which may occur during semiconductor fabrication, and which may be resolved by the present invention. As is known in the art, a post exposure bake process can accelerate the amplification of a latent image formed on a chemically amplified resist by accelerating the activity of PGA formed during exposure to patterned radiation. In conventional techniques, however, the advantages offered by methods for forming resist patterns through amplification of a latent image may be significantly offset by loss of final image resolution due to diffusion of the PGA during amplification. Structure 170 in FIG. 1B shows diffusion of PGA 108 subsequent to lithographic exposure. As a result of diffusion of PGA across the boundary defined by desired dimension 106 in FIG. 1A, a new boundary corresponding to diffused dimension 112 is defined in FIG. 1B.

Structure 180 in FIG. 1C shows the consequences of PGA diffusion for development of a pattern on resist layer 140. As shown in FIG. 1C, developed dimension 114 produced on resist layer 140, although intended to correspond to desired dimension 106 in FIG. 1A, more closely resembles diffused dimension 112 in FIG. 1B. As can be seen in FIG. 1C, developed dimension 114 is considerably broader than desired dimension 106, resulting in diffusive blurring of the developed pattern, corresponding to the diffusion of PGA subsequent to lithographic exposure. While undesirable in substantially all cases, diffusive blurring is particularly troublesome in high resolution lithographic processes, for which even small dimensional deviations can result in substantial deterioration in resolution and contrast.

Figure 2:
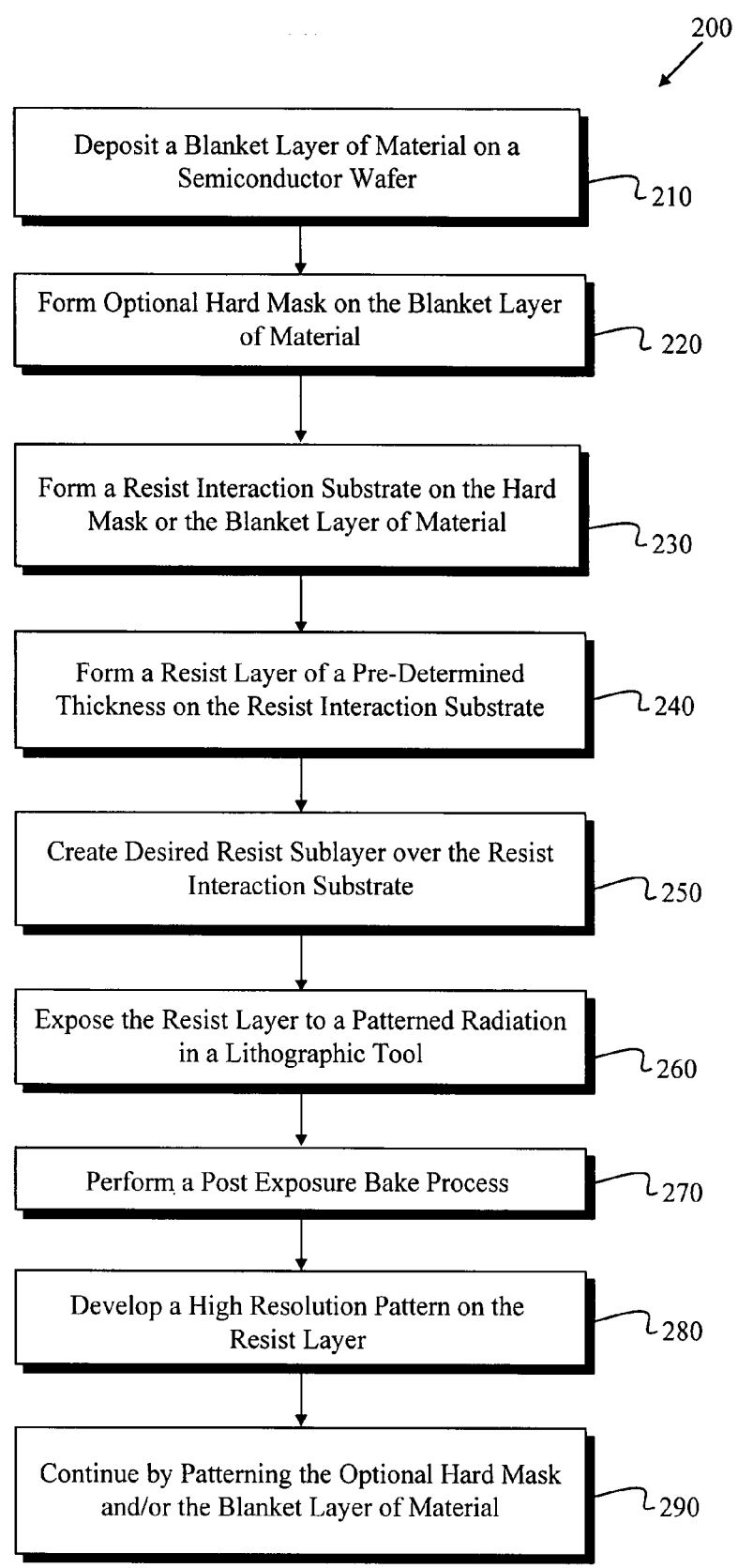
FIG. 2 shows a flowchart of an exemplary method to implement an embodiment of the present invention.

FIG. 2 shows a flowchart illustrating an exemplary method for producing a high resolution resist pattern on a semiconductor wafer, according to one embodiment of the present invention, which limits the undesirable diffusive blurring described above. Certain details and features have been left out of flowchart 200 that are apparent to a person of ordinary skill in the art. For example, a step may comprise one or more substeps or may involve specialized equipment or materials, as known in the art. While steps 210 through 290 indicated in flowchart 200 are sufficient to describe one embodiment of the present invention, other embodiments of the invention may utilize steps different from those shown in flowchart 200.

Step 210 of flowchart 200 in FIG. 2 comprises depositing a blanket layer of material on a semiconductor wafer. The blanket layer of material is the layer to be patterned as a result of semiconductor wafer fabrication, and can comprise a conductive material, such as polysilicon, aluminum, or copper, or a dielectric material, such as silicon dioxide or silicon nitride, for example. In other embodiments, there may be more than one blanket layer of material, and those additional layers may ultimately include additional patterns, for example, circuits or connective traces.

Continuing with step 220 in FIG. 2, step 220 of flowchart 200 comprises formation of a hard mask on the blanket layer of material deposited in step 210. It should be noted that this is an optional step, which may be included where required for production of a desired pattern, but may otherwise be omitted. In those embodiments in which formation of a hard mask is desirable, the hard mask can comprise, for example, silicon oxide, silicon nitride, or silicon oxy-nitride.

Referring to step 230 in FIG. 2, step 230 of flowchart 200 comprises formation of a resist interaction substrate on the hard mask formed in previous step 220, or on the blanket layer of material deposited in step 210 in those embodiments in which optional step 220 is omitted. In the present embodiment, formation of a resist interaction substrate works in conjunction with formation of a resist layer of a pre-determined thickness, in subsequent step 240, to limit diffusive blurring and enable production of a high resolution resist pattern on a semiconductor wafer. The resist interaction substrate may comprise any material capable of forming an attractive interaction with a resist layer so as to limit diffusive blurring in the resist layer. For example, the resist interaction substrate may comprise gold.

Figure 3:
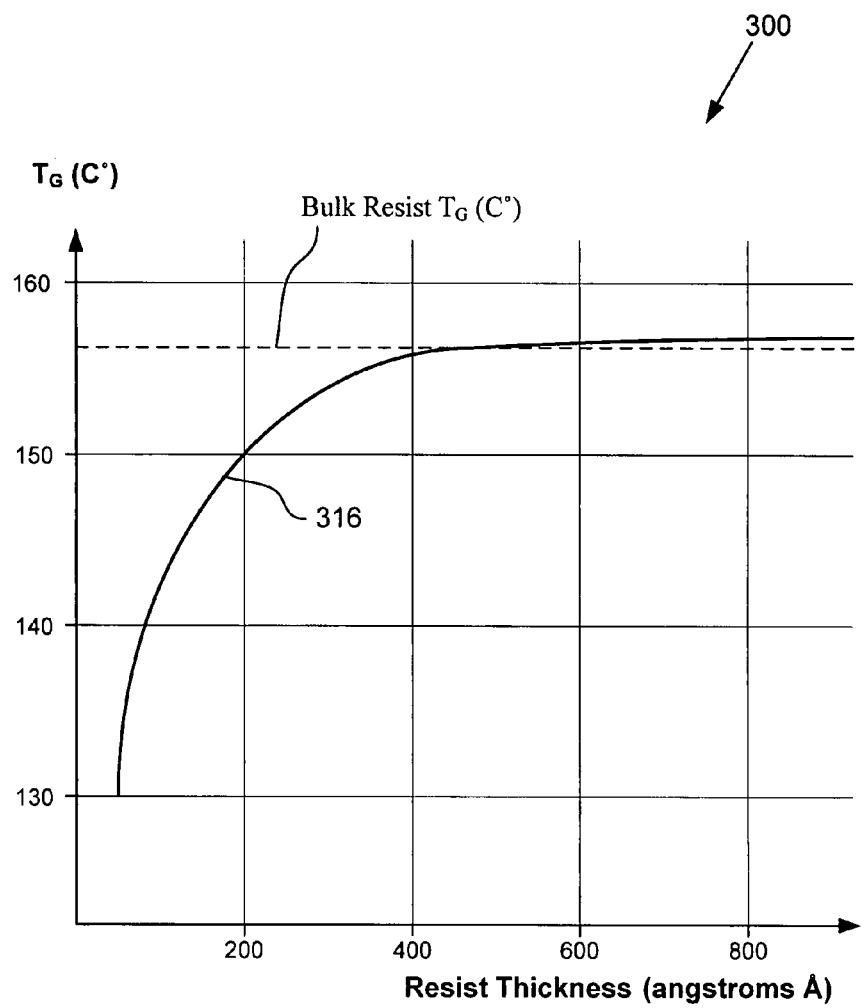
FIG. 3 is a graph showing glass transition temperatures of an exemplary resist across an exemplary range of resist thicknesses.
Figure 4:
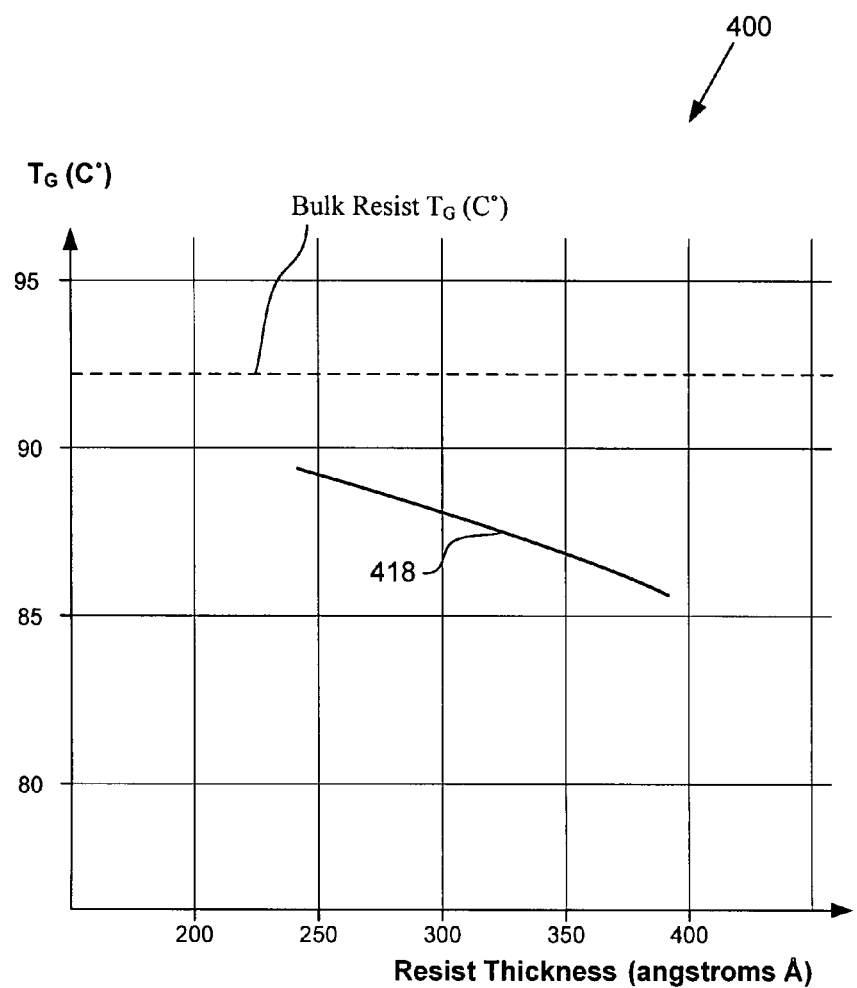
FIG. 4 is a graph showing glass transition temperatures of an exemplary composition across an exemplary range of resist thicknesses.

The role of a resist interaction substrate formed in step 230 of flowchart 200 may be best described in combination with FIGS. 3 and 4, which, respectively, show glass transition temperatures for an exemplary resist material, and for an exemplary composition combining a resist with a resist interaction substrate, across a range of resist thicknesses. Turning first to FIG. 3, structure 300 is a graph of glass transition temperature ($T_G$) expressed in degrees Centigrade, as a function of resist thickness, expressed in Angstroms, for an exemplary resist material, i.e. poly(3-methyl-4-hydroxy styrene). Appearing as a horizontal dashed line in FIG. 3 is the $T_G$ of the resist material in its bulk form. Curve 316 shows the transition away from bulk value for resist layers having thicknesses less than approximately 800 Angstroms (referred to as "ultra-thin resist layers" in the present application).

As can be seen from structure 300 in FIG. 3, as the thickness of an ultra-thin resist layer drops below about 400 Angstroms, its $T_G$ diverges sharply from the $T_G$ of that material in bulk. As is known in the art, the effective diffusion rate coefficient associated with a resist material may be correlated to its $T_G$. It is well understood that diffusion is markedly less in a material at temperatures below its $T_G$, and substantially greater at temperatures above that mark. Thus, a reduction in the $T_G$ of an ultra-thin resist may be seen to raise concerns about a corresponding increase in diffusion and associated diffusive blurring.

Turning now to FIG. 4, structure 400 in FIG. 4 shows the ameliorative effect on the $T_G$, of forming a resist layer in conjunction with a resist interaction substrate. Structure 400 is a graph of $T_G$, expressed in degrees Centigrade, as a function of resist thickness, expressed in Angstroms, for an exemplary composition comprising a polystyrene-pyrene resist formed over gold. Appearing as a horizontal dashed line in FIG. 4 is the $T_G$ of the resist material in its bulk form. Curve 418 shows that, despite the tendency for $T_G$ to drop sharply with reductions in resist thickness for ultra-thin resist layers, when the resist layer is formed over an appropriate material, giving rise to an attractive interaction between that material and the resist, a thermophysical property such as $T_G$ may actually be enhanced by reductions in resist thickness. Thus, in contrast to the performance of the resist layer alone, shown in FIG. 3, FIG. 4 shows that when combined with an appropriate resist interaction substrate, some thermophysical properties of ultra-thin resist layers may approach bulk values with decreasing resist thickness.

Proceeding with step 240 in FIG. 2, step 240 of flowchart 200 comprises formation of a resist layer having a pre-determined thickness on the resist interaction substrate. In the present embodiment, the resist layer can be a chemically amplified resist comprising a polymer matrix and one or more catalytic species, for example. The polymer matrix can further comprise an organic polymer material comprising, for instance, styrene, acrylate, or methacrylate monomers. In other embodiments, the resist layer can comprise different organic or inorganic polymers. The catalytic species present in the resist layer may be, for example, an acid, base, or oxidizing agent, activated by exposure to patterned radiation. More specifically, the resist layer may include PGA as the catalytic species, for example. The resist layer can be formed over the resist interaction substrate by using a spin coat process or other suitable deposition process, as known in the art.

Figure 5:
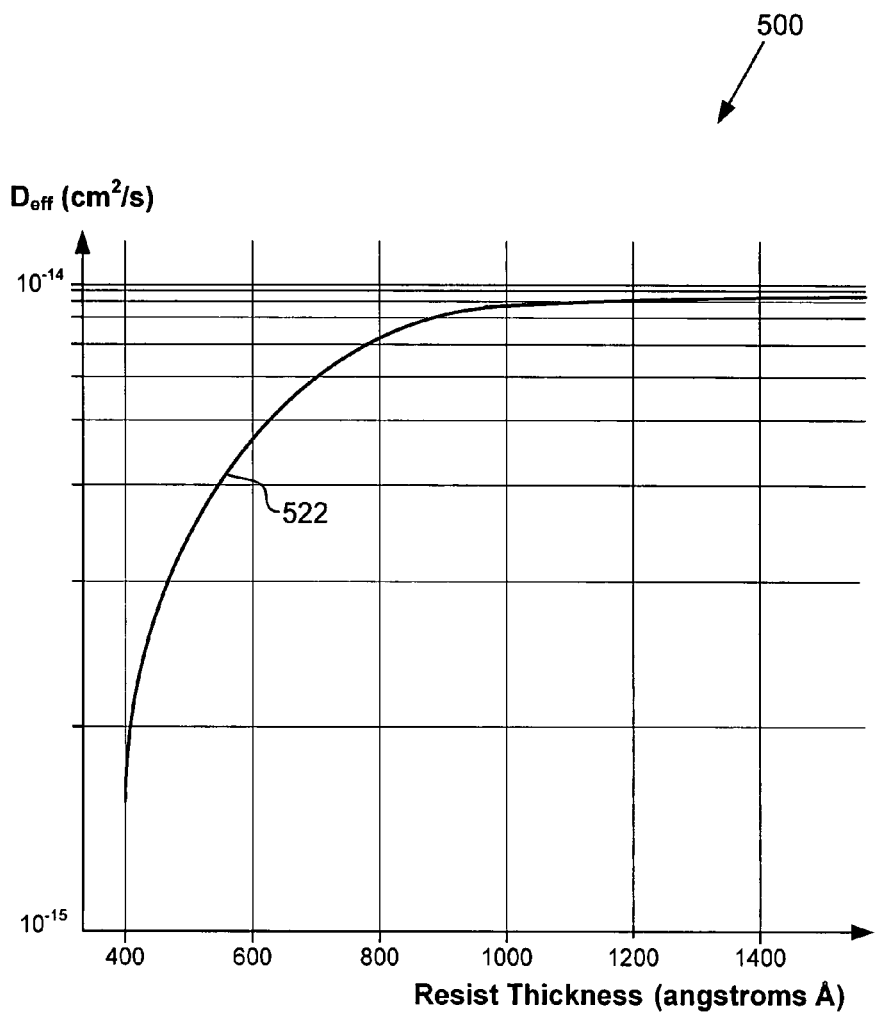
FIG. 5 is a graph showing the effective diffusion rate coefficients of an exemplary resist across an exemplary range of resist thicknesses.

Turning to FIG. 5 while considering step 240 of FIG. 2, structure 500 shows the effective diffusion rate coefficient ($D_{eff}$) of a resist as a function of resist thickness in Angstroms, at a constant temperature. Curve 522 shows the precipitous decline in $D_{eff}$ as the thickness of a resist layer is reduced into the ultra-thin resist layer range described previously. For resist thicknesses less than approximately 800 Angstroms, $D_{eff}$ can be seen to decline rapidly with reductions in resist thickness. In and of itself, the reduction in Doff with resist thickness is of limited assistance in pre-determining an appropriate resist thickness for limiting diffusive blurring during production of a high resolution pattern, because of the significant reduction in $T_G$ associated with similar dimensional adjustments. In the absence of a thermophysical stabilizing influence, mere reductions in resist thickness create a dynamic interplay between a plunging $D_{eff}$ and a similarly plunging $T_G$ that may be difficult to predict.

The present invention resolves those uncertainties, however, by stabilizing $T_G$ through introduction of a resist interaction substrate, described in conjunction with previous step 230. In light of the ameliorative effect of a resist interaction substrate on $T_G$, even in the presence of reduced resist layer thickness as shown in FIG. 4, a pre-determined thickness may be selected so as to optimize $D_{eff}$ with lessened concern about the impact of resist thickness on $T_G$. Consequently, a resist layer thickness may be formed in step 240 so as to limit diffusive blurring to dimensions that do not challenge the resolution required of the pattern to be produced on the resist. In other words, the formation of a resist interaction substrate in step 230 permits formation of a resist layer having a thickness pre-determined to be optimal with respect to limiting diffusive blurring during production of a high resolution resist pattern on a semiconductor wafer.

Continuing with step 250 in FIG. 2, step 250 of flowchart 200 comprises formation of a resist sublayer over the resist interaction substrate. Although previous steps 230 and 240, without more, are sufficient to limit diffusive blurring and enable production of a high resolution resist pattern on a semiconductor wafer, step 250 is an optional additional measure to further enhance the thermophysical properties of the resist layer. A resist sublayer may be created, for example, through use of an electron beam tuned to selectively crosslink one or more monolayers of resist material formed over the resist interaction substrate. This group of crosslinked layers within the resist can constitute a resist sublayer.

Figure 6:
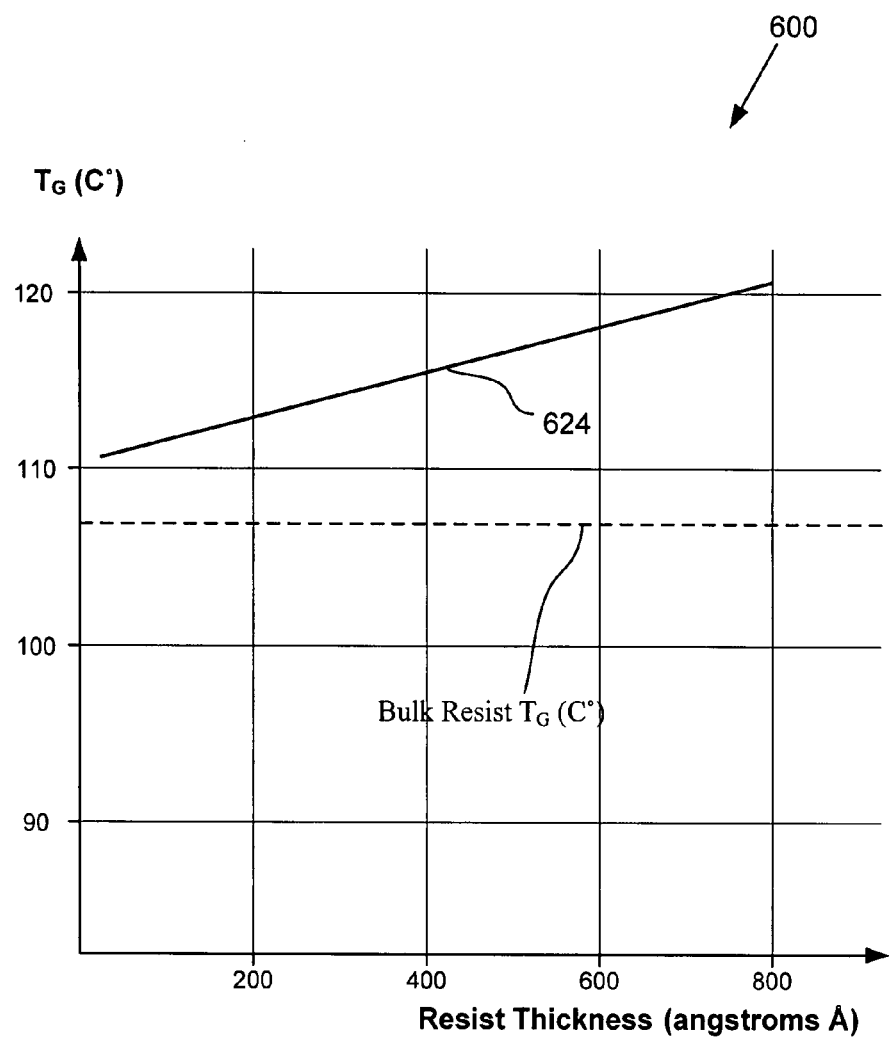
FIG. 6 is a graph showing glass transition temperatures of an exemplary resist sublayer across an exemplary range of resist thicknesses.

FIG. 6 shows the effects on $T_G$ of creating such a resist sublayer in step 250. Structure 600 is a graph of $T_G$ expressed in degrees Centigrade, as a function of resist thickness, expressed in Angstroms, for an exemplary resist material having undergone crosslinking. Appearing as a horizontal dashed line in FIG. 6, is the $T_G$ of the un-crosslinked resist material in its bulk form. Curve 624 shows that, despite the tendency for $T_G$ to drop sharply with reductions in resist thickness for ultra-thin resist layers, when the resist layer is selectively crosslinked, $T_G$ may actually exceed values for the resist in its bulk form.

Figure 7:
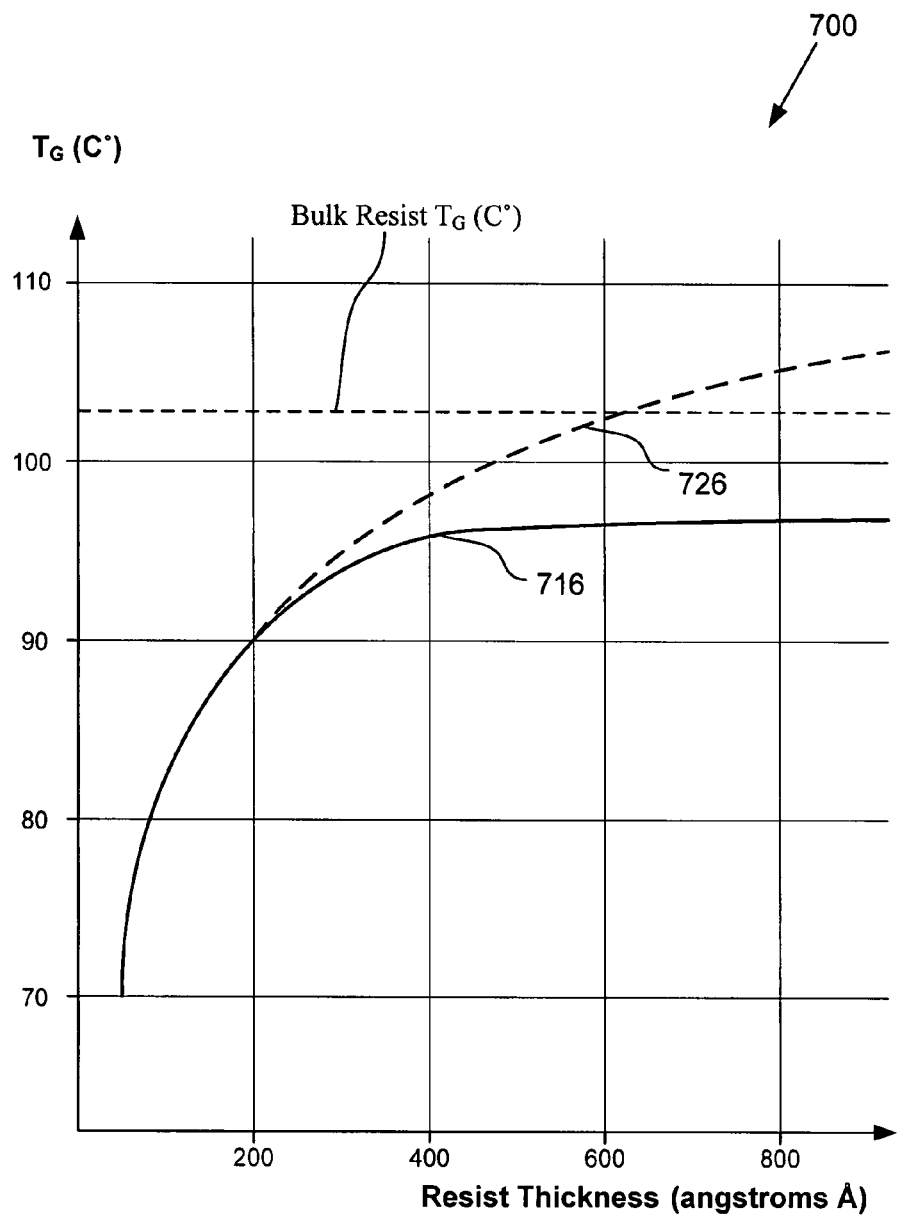
FIG. 7 is a graph showing glass transition temperatures of exemplary resist materials across an exemplary range of resist thicknesses.

In one embodiment, the present application's method can include a step (not shown in FIG. 2) in which the resist layer is formulated with an additive to further improve its thermophysical properties. FIG. 7 shows the effects of one such additive. Structure 700 is a graph of $T_G$ expressed in degrees Centigrade, as a function of resist thickness, expressed in Angstroms, for an exemplary resist material comprising polysilicon, compared with polysilicon containing fullerite as an additive. Appearing as a horizontal dashed line in FIG. 7 is the $T_G$ of fullerite free polysilicon in its bulk form. Curve 716 shows the reduction in $T_G$ with reduced resist thickness for the polysilicon resist. Curve 726 shows the $T_G$ across the same range of resist thicknesses for the polysilicon resist containing fullerite (10 wt. % by polymer). As can be seen in FIG. 7, inclusion of a resist additive, such as fullerite, may increase the $T_G$ for a resist across a substantial portion of resist thicknesses associated with reductions in diffusion.

Figure 8A:
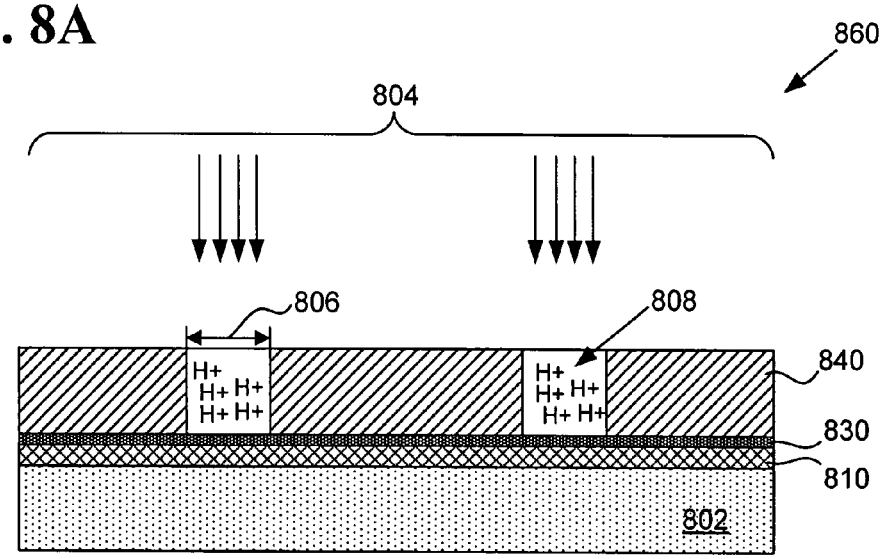
FIGS. 8A, 8B, and 8C show cross-sectional views of a semiconductor wafer during lithographic patterning, according to one embodiment of the present invention.
Figure 8B:
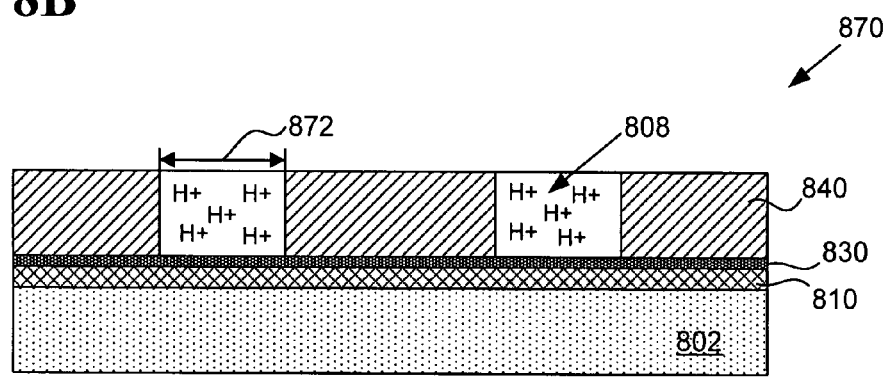
Figure 8C:
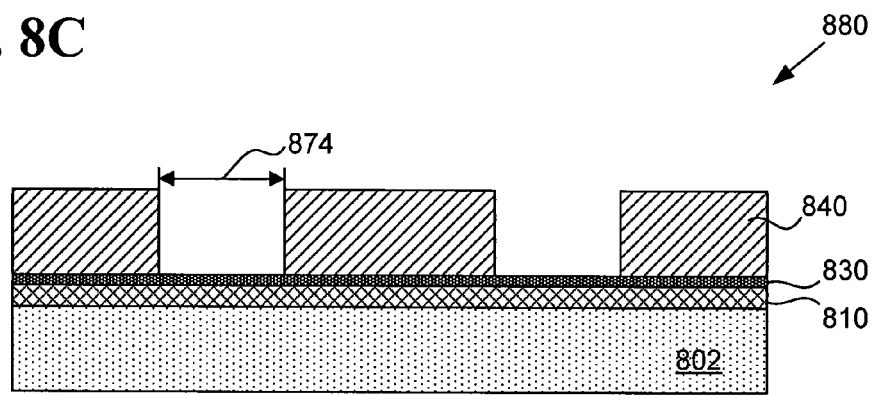

FIGS. 8A, 8B, and 8C show cross-sectional views of a semiconductor wafer during lithographic patterning, according to one embodiment of the present invention. Structures 860, 870, and 880, appearing respectively in FIGS. 8A, 8B, and 8C, show cross-sectional views of resist layer 840 formed over semiconductor wafer 802, corresponding to resist layer 140 formed over semiconductor 102 in FIGS. 1A, 1B, and 1C. Moreover, patterned radiation 804, desired dimension 806, and PGA 808 in FIG. 8A, correspond respectively to patterned radiation 104, desired dimension 106, and PGA 108 in FIG. 1A. Similarly, diffusive dimension 872 in FIG. 8B corresponds to diffused dimension 172 in FIG. 1B, while developed dimension 874 in FIG. 8C corresponds to developed dimension 174 in FIG. 1C. FIGS. 8A, 8B, and 8C also include blanket layer of material 810 and resist interaction substrate 830, having no analogues in FIGS. 1A, 1B, and 1C.

Referring to FIGS. 8A, 8B, and 8C, structures 860, 870, and 880 show the result of performing steps 260, 270, and 280 of flowchart 200 of FIG. 2, respectively. At step 260 in FIG. 2 and structure 860 in FIG. 8A, resist layer 840 is exposed to patterned radiation 804 under vacuum conditions in a lithographic tool in a lithographic process. During the lithographic process, a pattern on a lithographic mask (not shown) can be transferred to resist layer 840 formed over semiconductor wafer 802 by utilizing a low intensity radiation source, such as an EUV light source. In another embodiment, an electron beam, or an ion beam may provide patterned radiation 804, for example. In the lithographic process, exposure to patterned radiation 804 activates a catalytic species in the resist so as to form a latent image corresponding to the pattern that is to be transferred to resist 840 from the lithographic mask.

Continuing with step 270 in FIG. 2 and structure 870 in FIG. 8B, a typical post exposure bake process is performed. As is known in the art, a post exposure bake process can accelerate the amplification of a latent image formed on a resist layer, by accelerating the chemically catalyzed solubility changes activated by exposure to patterned radiation. For example, activation of a PGA catalyst in a resist layer may trigger solubility changes in the resist layer, which are amplified through activity of the PGA. Post exposure baking accelerates that chemical amplification of the latent image on the resist layer. The resulting solubility differential between exposed and unexposed areas of the resist layer facilitates development of the patterned resist in a subsequent step.

In conventional techniques, however, the advantages offered by methods for forming resist patterns through chemical amplification of a latent image may be significantly offset by loss of final image resolution due to diffusion of the catalytic species during amplification. During the post exposure bake, there may be some tendency for the catalytic species to diffuse across a boundary defining the border of a latent image formed during exposure to patterned radiation.

The present invention resolves the problems present in conventional approaches by limiting diffusion of a catalytic species, through the combination of a resist layer having a pre-determined thickness and a resist interaction substrate, as described previously. By limiting diffusion and associated diffusive blurring, the present embodiment overcomes the disadvantages associated with diffusion in conventional techniques, while retaining the sensitivity advantages available through use of a chemically amplified patterning process. The present invention thus enables use of chemically amplified patterning processes for producing high resolution resist patterns.

Continuing with step 280 of flowchart 200 and structure 880 in FIG. 8C, a high resolution resist pattern is developed. Developed dimension 874 can be created by application of a developing reagent to the resist material in any suitable developing process, as known in the art. In the developing process, the resist can be immersed in a solution containing dissolution reagent, for example.

Finally, in step 290 of flowchart 200 in FIG. 2, fabrication of the semiconductor wafer continues with patterning of the hard mask, if formed in step 220, or direct patterning of the blanket layer of material deposited in step 210. Regardless of the specific additional steps undertaken, formation of the high resolution resist pattern results from chemical amplification of solubility changes in the resist material subsequent to lithographic exposure. That process, in turn, is enabled by the present method, which limits diffusive blurring during pattern production.

Thus, in the embodiment shown in flowchart 200 in FIG. 2, the present invention enables the significantly increased exposure sensitivity to low intensity or highly attenuated radiation available through chemical amplification of solubility changes in a resist layer, by limiting diffusive blurring during pattern production. The present invention advantageously increases both resolution and contrast in lithographic processes relying on low intensity or highly attenuated radiation, while avoiding the diffusion problem endemic to conventional methods relying on, for example, acid catalysis, and well known in the art.

As a result of the method for producing a high resolution resist pattern on a semiconductor wafer, described in the exemplary embodiments set forth in the present application and shown by flowchart 200 in FIG. 2, a semiconductor wafer having one or more semiconductor dies is fabricated. In a subsequent step (not shown on flowchart 200) the semiconductor dies can be separated from the semiconductor wafer in a dicing process after wafer fabrication has been completed. The fabricated and separated semiconductor die, which is fabricated by using the present invention's method for producing a high resolution resist pattern on a semiconductor wafer, can be utilized on a circuit board, for example. The diced and separate dies can be packaged, i.e. can be enclosed and/or sealed in suitable semiconductor packages, as known in the art.

Figure 9:
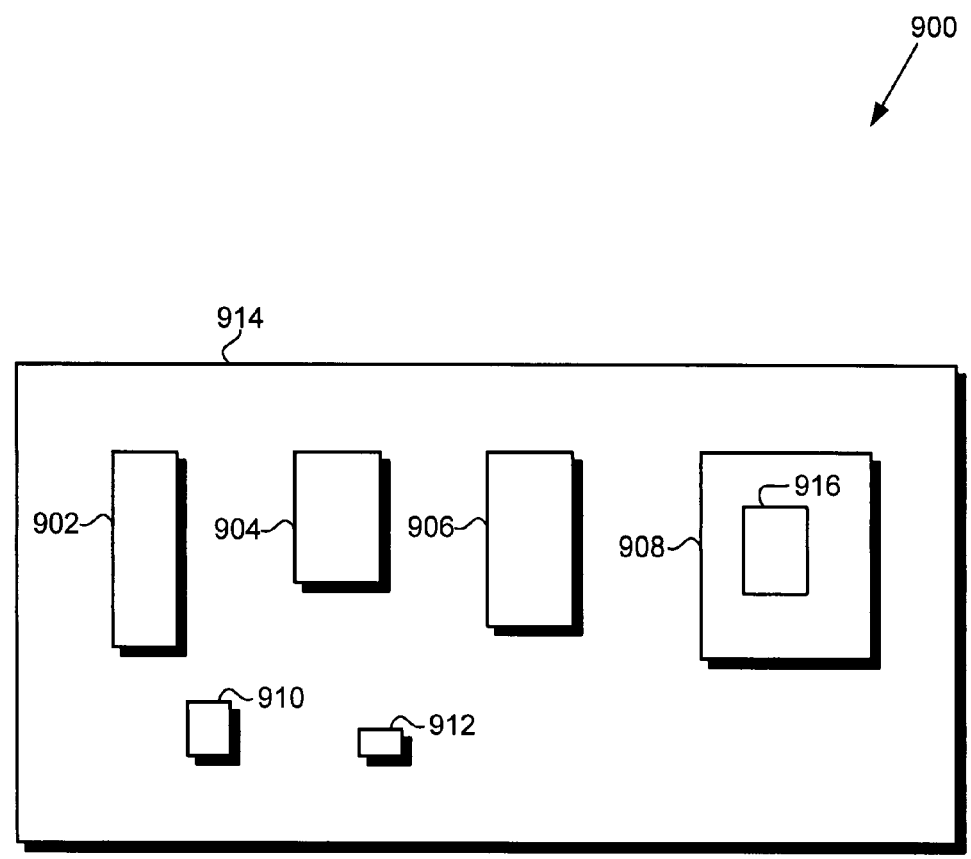
FIG. 9 is a diagram of an exemplary electronic system including an exemplary chip or die fabricated using a method for producing a high resolution resist pattern on a semiconductor wafer, in accordance with one or more embodiments of the present invention.

FIG. 9 is a diagram of an exemplary electronic system including an exemplary chip or die fabricated by using the present invention's method for producing a high resolution resist pattern on a semiconductor wafer, in accordance with one or more embodiments of the present invention. Electronic system 900 includes exemplary modules 902, 904, and 906, IC chip 908, discrete components 910 and 912, residing in and interconnected through circuit board 914. In one embodiment, electronic system 900 may include more than one circuit board. IC chip 908 can comprise a semiconductor die, which is fabricated by using an embodiment of the invention's method for forming a high resolution resist pattern on a semiconductor wafer. IC chip 908 includes circuit 916, which can be a microprocessor, for example.

As shown in FIG. 9, modules 902, 904, and 906 are mounted on circuit board 914 and can each be, for example, a central processing unit (CPU), a graphics controller, a digital signal processor (DSP), an application specific integrated circuit (ASIC), a video processing module, an audio, processing module, an RF receiver, an RF transmitter, an image sensor module, a power control module, an electro-mechanical motor control module, or a field programmable gate array (FPGA), or any other kind of module utilized in modern electronic circuit boards. Circuit board 914 can include a number of interconnect traces (not shown in FIG. 9) for interconnecting modules 902, 904, and 906, discrete components 910 and 912, and IC chip 908.

Also shown in FIG. 9, IC chip 908 is mounted on circuit board 914 and can comprise, for example, any semiconductor die that is fabricated by utilizing an embodiment of the invention's method for producing a high resolution resist pattern on a semiconductor wafer. In one embodiment, IC chip 908 may not be mounted on circuit board 914, and may be interconnected with other modules on different circuit boards. Further shown in FIG. 9, discrete components 910 and 912 are mounted on circuit board 914 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 900 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, a method for producing a high resolution resist pattern on a semiconductor wafer provides significantly increased exposure sensitivity to low intensity radiation, while avoiding the dimensional constraints imposed by diffusion of a catalytic species in conventional methods. By limiting diffusive blurring, while amplifying the effect of exposure to low intensity or highly attenuated radiation through chemically amplified solubility changes in a resist material, the invention's method advantageously increases both resolution and contrast during lithographic processing of semiconductor wafers.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for producing a high resolution resist pattern on a semiconductor wafer has been described.

The invention claimed is:

1. A method for producing a high resolution resist pattern on a semiconductor wafer, said method comprising:
   forming a resist layer of a pre-determined thickness on a resist interaction substrate over said semiconductor wafer, said resist interaction substrate selected to stabilize a glass transition temperature ($T_G$) of said resist layer when said resist layer comprises an ultra-thin resist including a plurality of resist monolayers;
   selectively cross-linking at least one of said plurality of resist monolayers to form a resist sublayer in said resist layer prior to exposing said resist layer to a patterned radiation in a lithographic tool;
   exposing said resist layer to said patterned radiation in said lithographic tool, said resist layer including said resist sublayer being exposed by said patterned radiation;
   developing said high resolution resist pattern on said resist layer over said semiconductor wafer.

2. The method of claim 1 wherein said exposing to said patterned radiation comprises exposure to extreme ultraviolet (EUV) light.

3. The method of claim 1 wherein said exposing to said patterned radiation comprises exposure to an electron beam.

4. The method of claim 1 wherein said exposing to said patterned radiation comprises exposure to an ion beam.

5. The method of claim 1 wherein said resist interaction substrate comprises gold.

6. The method of claim 1 wherein said resist layer is an ultra-thin resist layer.

7. The method of claim 1 wherein said resist layer comprises an additive selected from the group consisting of pyrene and fullerite.

8. The method of claim 1 wherein said resist layer comprises a chemically amplified resist including a catalytic species.

9. The method of claim 1, wherein said selectively cross-linking said at least one of said plurality of resist monolayers is performed using an electron beam.

10. The method of claim 1, further comprising dicing said semiconductor wafer into a plurality of semiconductor dies.

11. The method of claim 10, further comprising utilizing one or more of said plurality of semiconductor dies in a circuit board.

12. The method of claim 10, further comprising packaging one or more of said plurality of semiconductor dies.

13. The method of claim 10, wherein one or more of said plurality of semiconductor dies are utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

14. A method for producing a high resolution resist pattern on a semiconductor wafer, said method comprising:

forming a resist layer of a pre-determined thickness on a resist interaction substrate over said semiconductor wafer, said resist interaction substrate selected to stabilize a glass transition temperature ($T_G$) of said resist layer when said resist layer comprises an ultra-thin resist including a plurality of resist monolayers;

selectively cross-linking at least one of said plurality of resist monolayers to form a resist sublayer in said resist layer prior to exposing said resist layer to a patterned radiation in a lithographic tool;

exposing said resist layer to said patterned radiation in said lithographic tool, said resist layer including said resist sublayer being exposed by said patterned radiation;

wherein an attractive interaction between said resist layer and said resist interaction substrate limits diffusive blurring during production of said high resolution pattern on said semiconductor wafer.

15. The method of claim 14 wherein said resist layer comprises a chemically amplified resist.

16. The method of claim 14 wherein said resist interaction substrate comprises gold.

17. The method of claim 14, further comprising dicing said semiconductor wafer into a plurality of semiconductor dies.

18. The method of claim 17, further comprising utilizing one or more of said plurality of semiconductor dies in a circuit board.

19. The method of claim 17, further comprising packaging one or more of said plurality of semiconductor dies.

20. The method of claim 17, wherein one or more of said plurality of semiconductor dies are utilized in a circuit board as part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally controlled home appliance, a printer, a copier, a digital audio or video receiver, an RF transceiver, a personal digital assistant (PDA), a digital game playing device, a digital testing and/or measuring device, a digital avionics device, a medical device, and a digitally controlled medical equipment.

* * * * *